(12) United States Patent
Cheng

(10) Patent No.: US 10,263,014 B2
(45) Date of Patent: Apr. 16, 2019

(54) FIN-TYPE FIELD-EFFECT TRANSISTOR

(71) Applicant: International Business Machines Corporation, Armonk, NY (US)

(72) Inventor: Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/793,289

(22) Filed: Oct. 25, 2017

(65) Prior Publication Data
US 2018/0061864 A1   Mar. 1, 2018

Related U.S. Application Data

(62) Division of application No. 15/196,353, filed on Jun. 29, 2016, now Pat. No. 9,859,302.

(51) Int. Cl.
H01L 21/84 (2006.01)
H01L 27/12 (2006.01)
H01L 49/02 (2006.01)

(52) U.S. Cl.
CPC ........ *H01L 27/1211* (2013.01); *H01L 21/845* (2013.01); *H01L 28/40* (2013.01); *H01L 28/92* (2013.01)

(58) Field of Classification Search
CPC .............................. H01L 28/92; H01L 21/845
See application file for complete search history.

(56) References Cited

U.S. PATENT DOCUMENTS

2015/0097220 A1* 4/2015 Ponoth ............... H01L 27/0629
                                                         257/296
2015/0145048 A1* 5/2015 Cheng ................ H01L 27/1211
                                                         257/351

OTHER PUBLICATIONS

List of IBM Patents or Patent Applications Treated as Related (Appendix P); Filed Oct. 25, 2017, 2 pages.
Kangguo Cheng "Fin-Type Field-Effect Transistor," U.S. Appl. No. 15/196,353, filed Jun. 29, 2016.

* cited by examiner

*Primary Examiner* — Moazzam Hossain
*Assistant Examiner* — Farun Lu
(74) *Attorney, Agent, or Firm* — Cantor Colburn LLP; Vazken Alexanian

(57) ABSTRACT

This invention relates to a fin field-effect transistor semiconductor structure. The method of forming the semiconductor structure can include patterning a plurality of precursor fins on a semiconductor layer having a layer portion A and a layer portion B. The semiconductor layer can be located on a substrate. The layer portion B can be selectively etched to form B fins and a top half of precursor fins. The layer portion A can be selectively etched to form A fins and the substrate can be etched to form a bottom half of the decoupling fins. The precursor fins can be removed to expose the A fins, the decoupling fins, and the B fins. One of the A fins and the B fins can form n-type fins and the other can form p-type fins.

9 Claims, 4 Drawing Sheets

FIN-TYPE FIELD-EFFECT TRANSISTOR

DOMESTIC AND/OR FOREIGN PRIORITY

This application is a divisional of U.S. application Ser. No. 15/196,353, titled "FIN-TYPE FIELD-EFFECT TRANSISTOR" filed Jun. 29, 2016, the entire contents of which are incorporated herein by reference.

BACKGROUND

The present invention relates to a fin-type field-effect transistor (finFET) component and a method of forming the same.

The slow frequency response of off-chip capacitance makes off-chip capacitor arrangements unsuitable for providing the decoupling capacitance necessary to prevent circuit failures in high speed integrated circuit devices. Accordingly, in order to provide sufficient decoupling capacitance for high frequency circuits, the capacitance must be moved closer to the switching circuitry, onto the integrated circuit chip itself. However, there are various areas of concern in on-chip decoupling capacitor design.

Using a finFET based technology provides advantages toward high speed complementary metal oxide semiconductors (CMOS). Field-effect transistors (FETs) are the basic electrical devices of today's integrated circuits and are used in almost all types of integrated circuit design (i.e., microprocessors, memory, etc.). A finFET is one type of FET that has been proposed to facilitate increased device performance. In a finFET, a vertical "fin" shaped structure is defined to form the body of the transistor. Gates are then formed on one or both sides of the fin. When gates are formed on both sides of the fin, short channel effects (SCE) can be reduced, providing for lower leakage, and for more ideal switching behavior. In addition, the use of the double gate increases gate area, which can allow the finFET to have better current control, without increasing the gate length (also called "gate thickness") of the device. As such, the finFET is able to have the current control of a larger transistor without requiring the device space of the larger transistor.

SUMMARY

According to an embodiment of the present invention, a method of forming the semiconductor structure can include patterning a plurality of precursor fins on a semiconductor layer having a layer portion A and a layer portion B. The semiconductor layer can be located on a substrate. The layer portion A and the layer portion B can have one or both of a different relative strain level and a different chemical composition. The layer portion B can be selectively etched to form a plurality of B fins and a top half of a plurality of precursor fins. The layer portion A can be selectively etched to form a plurality of A fins and the substrate can be etched to form a bottom half of the plurality of decoupling fins. The plurality of precursor fins can be removed to expose the plurality of A fins, the plurality of decoupling fins, and the plurality of B fins. The plurality of A fins can form a plurality of n-type fins (NFET fins) and the plurality of B fins can form a plurality of p-type fins (PFET fins); or the plurality of A fins can form the plurality of PFET fins and the plurality of B fins can form the plurality of NFET fins.

According to another embodiment, a method of forming a semiconductor structure includes patterning a plurality of precursor fins on a semiconductor layer having a layer portion A and a layer portion B. The layer portion A and the layer portion B can have one or both of a different strain level and a different chemical composition. A first portion of the precursor fins can be located on the layer portion A and a second portion of the precursor fins can be located on the layer portion B. The semiconductor layer can be located on a substrate. The first portion of the precursor fins can be masked. After masking the first portion of the precursor fins, the layer portion B can be etched to form a top half of a plurality of decoupling fins and a plurality of B fins. The first portion of the precursor fins can be unmasked and the plurality of B fins can be masked. After masking the plurality of B fins, the layer portion A can be etched to form a plurality of A fins and etching into the substrate to form a bottom half of the plurality of decoupling fins. The plurality of B fins can be unmasked. The plurality of precursor fins can be removed to expose the plurality of A fins, the plurality of decoupling fins, and the plurality of B fins. The plurality of A fins can form a plurality of NFET fins and the plurality of B fins can form a plurality of PFET fins; or the plurality of A fins can form the plurality of PFET fins and the plurality of B fins can form the plurality of NFET fins.

Yet, according to another embodiment, a semiconductor structure can include a substrate and a plurality of fins located on the substrate. The plurality of fins can include a plurality of NFET fins, a plurality of PFET fins, and a plurality of decoupling fins. A height y of the plurality of decoupling fins can be greater than one or both of a height x of the plurality of NFET fins and a height y of the plurality of PFET fins. The plurality of NFET fins can have a width n and the plurality of PFET fins can have a width p; and one or both of the following conditions can be satisfied: $(|n-p|)/n*100 \le 10\%$ and $(|n-p|)/p*100 \le 10\%$.

BRIEF DESCRIPTION OF THE DRAWINGS

Refer now to the figures, which are exemplary embodiments, and wherein the like elements are numbered alike.

FIG. 1 is an illustration of an embodiment of a cross-section of substrate for use in forming a finFET component;

FIG. 2 is an illustration of an embodiment of a cross-section of a finFET component having fin precursors formed thereon;

FIG. 3 is an illustration of an embodiment of a cross-section of a finFET component after a layer portion B etching operation;

FIG. 4 is an illustration of the cross-section of a cross-section of a finFET component after insulator layer etching operation;

FIG. 5 is an illustration of the cross-section of a cross-section of a finFET component after a silicon layer etching operation;

FIG. 6 is an illustration of the cross-section of a cross-section of a finFET component with the fin precursors removed;

DETAILED DESCRIPTION

Figure 1:
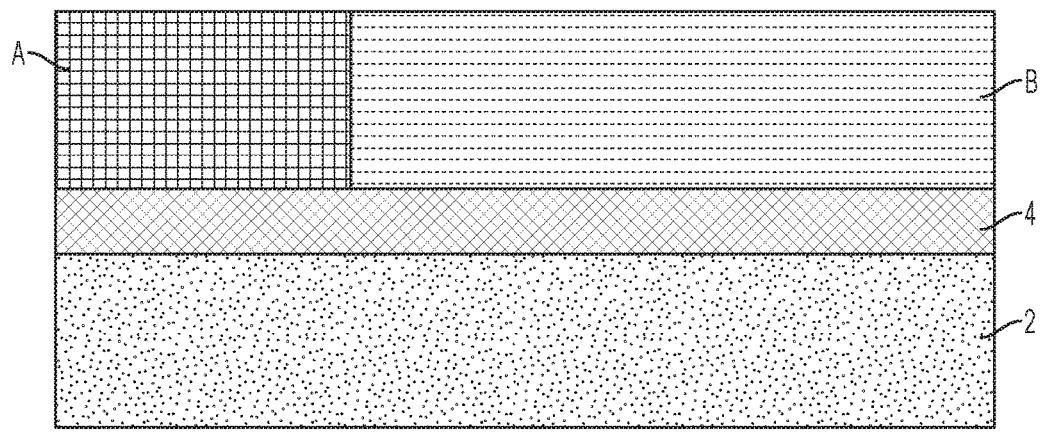
FIGS. 1-6 illustrate an embodiment of a method of preparing a finFET component.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present invention to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that includes a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both an indirect "connection" and a direct "connection."

For the sake of brevity, conventional techniques related to semiconductor device and IC fabrication may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention may be individually known, the present combination of operations and/or resulting structures of the present invention are unique. Thus, the unique combination of the operations described in connection with the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

In the formation of finFETs, it can be desirable to form a plurality of fins on a substrate from different materials. Forming such fins from multiple materials can result in fins having different widths as the respective materials will be etched at different rates under the same etching conditions. For example, using the same reactive ion etching operation in a silicon material for preparing fins in an NFET region of the finFET and in a silicon germanium material for preparing fins in a PFET region of the finFET will result in silicon fins that are wider than the corresponding silicon germanium fins; which ultimately decreases the performance of the finFET. Furthermore, the single etching operation in forming the fins of a finFET results in fins formed in the decoupling capacitor region of the finFET that have the same height as the fins formed in both the NFET and PFET regions.

The inventors hereof have developed an improved finFET component and a method of forming the same. The improved finFET can have one or both of fins in NFET and PFET regions having widths that vary by less than or equal to 10% and fins in a decoupling capacitor region that have an increased height with respect to the fins in the NFET and PFET regions. The increased height of the fins in the decoupling capacitor region can result in on-chip decoupling capacitors with an increased capacitance, resulting in a further minimization of voltage fluctuation.

The method of forming the finFET semiconductor structure can include patterning a plurality of precursor fins on a semiconductor layer having a layer portion A and a layer portion B. The semiconductor layer can be located on a substrate. The layer portion A and the layer portion B can have one or both of a different relative strain level and a different chemical composition. The layer portion B can be selectively etched to form a plurality of B fins and a top half of a plurality of precursor fins. The layer portion A can be selectively etched to form a plurality of A fins and the substrate can be etched to form a bottom half of the plurality of decoupling fins. The plurality of precursor fins can be removed to expose the plurality of A fins, the plurality of decoupling fins, and the plurality of B fins. The plurality of A fins can form a plurality of n-type fins (NFET fins) and the plurality of B fins can form a plurality of p-type fins (PFET fins); or the plurality of A fins can form the plurality of PFET fins and the plurality of B fins can form the plurality of NFET fins.

The method can include first selectively etching the plurality of PFET fins in a layer portion B and then selectively etching the plurality of NFET fins in a layer portion A. Conversely, the method can include first selectively etching the plurality of NFET fins in a layer portion A and then selectively etching the plurality of PFET fins in a layer portion B.

The layer portion A and the layer portion B can have one or both of a different relative strain level and a different chemical composition. Regarding the different strain levels, the layer portion A can be under a tensile strain and the layer portion B can be under a compressive strain; the layer portion A can be under a tensile strain and the layer portion B can be under a neutral strain; or the layer portion A can be under a neutral strain and the layer portion B can be under a compressive strain. Regarding the different chemical compositions, examples include instances where the layer portion A includes a silicon or a tensile silicon and the layer portion B includes silicon germanium; layer portion A includes a III-V compound (such as gallium arsenide) and the layer portion B includes silicon, germanium, or silicon germanium.

The decoupling fins can have an increased height relative to the height of the plurality of NFET and the plurality of PFET fins. The decoupling fins can include a top half and a bottom half. The top half material can be same or different from the layer portion A or the layer portion B. For example, the top half can be the same material as the layer portion A, the layer portion B, or can be a formed from a third layer portion. The bottom half of the decoupling fins can be formed from the substrate material.

The top half of the plurality of decoupling fins can be formed simultaneous to the etching of the layer portion A and the bottom half of the plurality of decoupling fins can be formed simultaneous to the etching of the layer portion B. The top half of the plurality of decoupling fins can be formed simultaneous to the etching of the layer portion B and the bottom half of the plurality of decoupling fins can be formed simultaneous to the etching of the layer portion A. The top half of the plurality of decoupling fins can be formed in a separate etching process from the etching of a first portion of fins (A fins or B fins) and the bottom half of the plurality of decoupling fins can be formed simultaneous to the etching of a second portion fins (the other of the A fins and the B fins). The top half of the plurality of decoupling fins can be formed simultaneous to the etching of a first portion of fins (A fins or B fins) and the bottom half of the plurality of decoupling fins can be formed in a separate etching process from the etching of second portion of fins (the other of the A fins and the B fins).

FIGS. 1-6 illustrate an embodiment of the fabrication of the finFET component in accordance with embodiments of the present invention.

The fabrication of the finFET component can be started with the layered substrate as illustrated in FIG. 1. The layered substrate can include substrate 2, optional insulator layer 4, and semiconductor layer located on top of the substrate 2 or insulator layer 4, if present. Semiconductor layer can include layer portion A and layer portion B.

The substrate can have a thickness of 0.1 to 750 micrometers. The substrate can include bulk Si and can have a thickness of 700 to 800 micrometers. The substrate can include silicon (Si), strained silicon, silicon carbide (SiC), germanium (Ge), silicon germanium (SiGe), silicon-germanium-carbon (SiGeC), a silicon alloy, a germanium alloy, gallium arsenide (GaAs), indium arsenide (InAs), indium phosphide (InP), cadmium arsenide, cadmium selenide, or a combination thereof.

The substrate can include a semiconductor-on-insulator (SOI) (such as a silicon-on-insulator) and can have a thickness of 5 to 200 nanometers. The substrate can include a semiconductor-on-insulator (SOI) substrate with an optional insulator layer. The insulator layer can be a buried oxide (BOX) layer. The insulator layer can include an oxide, for example, silicon dioxide, or can include a nitride, for example, silicon nitride.

The semiconductor layer can be formed by chemical vapor deposition (CVD), liquid phase (LP) chemical vapor deposition, reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes. The thickness of the semiconductor layer can be 5 to 200 nanometers. The semiconductor layer can be formed on a buried oxide layer (BOX) layer by wafer bonding.

Layer portion A can be under a tensile strain, and can include, for example, silicon and layer portion B can be a under a compressive strain and can include, for example, silicon germanium. Conversely, layer portion B can be under a tensile strain, and can include, for example, silicon and layer portion A can be a under a compressive strain and can include, for example, silicon germanium. The silicon germanium of layer, if present, can have a germanium concentration of 10 to 90 atomic %, or 20 to 40 atomic %.

Layer portion A and Layer portion B can each be independently doped or undoped. If doped, the dopant can include a p-type dopant (such as boron, indium, or a combination thereof) or an n-type dopant (such as phosphorus, arsenic, gallium, or a combination thereof).

Figure 2:
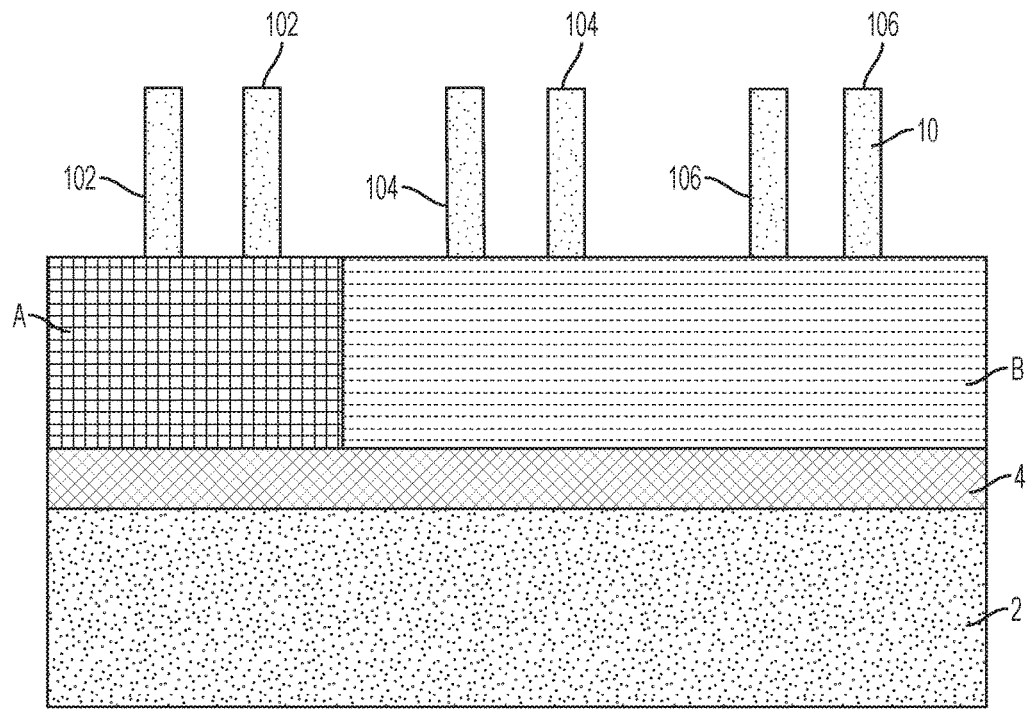

FIG. 2 is an illustration of fin patterning layer 10 located on the substrate. Selective reactive ion etching operations using fin patterning layer 10 as a patterning template can result in the formation of fins 102 located in layer portion A, fins 104 located in layer portion B in a decoupling capacitor region, and fins 106 located in layer portion B. Layer portion A can include an NFET region and layer portion B can include a PFET region. It is noted that fins located in an NFET region are also referred to herein as NFET fins, fins located in a decoupling capacitor region are also referred to herein as decoupling fins, and fins located in a PFET region are also referred to herein as PFET fins.

The fin patterning layer can include silicon nitride ($Si_3N_4$), hafnium dioxide ($HfO_2$), hafnium tantalum titanium oxide (HfTaTiO), hafnium silicate ($HfSiO_4$), nitrided hafnium silicates (HfSiON), hafnium dioxide ($HfO_2$), zirconium dioxide ($ZrO_2$), zirconium silicate ($ZrSiO_4$), aluminum oxide (Al$_2$O$_3$), germanium oxynitride (GeO$_x$N$_y$), or a combination thereof. The fin patterning layer can include silicon nitride.

The fins in the fin patterning layer can have a thickness of 5 to 200 nanometers, specifically, 10 to 150 nanometers, more specifically, 30 to 100 nanometers.

Fin patterning layer 10 can be formed using one or both of sidewall image transfer (SIT) and extreme ultraviolet (EUV) lithography, optionally in combination with conventional image transfer (CIT), for example, if broad fins are also desired. For example, using sidewall image transfer, a mandrel layer can be deposited on the substrate, optionally followed by deposition of one or both of an organic planarizing layer and an anti-reflective coating. A mask layer can then be deposited on the mandrel layer. The mask material can include a resist such as a photoresist and the mandrel material can be patterned by photolithography. An optional adhesion layer can be formed on top of the mandrel layer prior to applying the mask material.

The mask layer can then be patterned to form features that will protect regions of the mandrel layer. The unprotected region can then be etched away in an etching operation to form the patterned mandrel layer and the mask layer can be removed, for example, using a solvent or an aqueous developer, for example, using N-methyl-2-pyrrolidone (NMP), toluene, propylene glycol methyl ether acetate (PGMEA), tetramethylammonium hydroxide (TMAH), or a thereof.

A sidewall spacer layer can then be deposited on the patterned mandrel layer, followed by an anisotropic, top to bottom etching process, such as reactive ion etching. Following the top to bottom etching, the remaining mandrel layer can be removed, for example, by etching to form the fin patterning layer from the remaining sidewall spacer layer.

Figure 3:
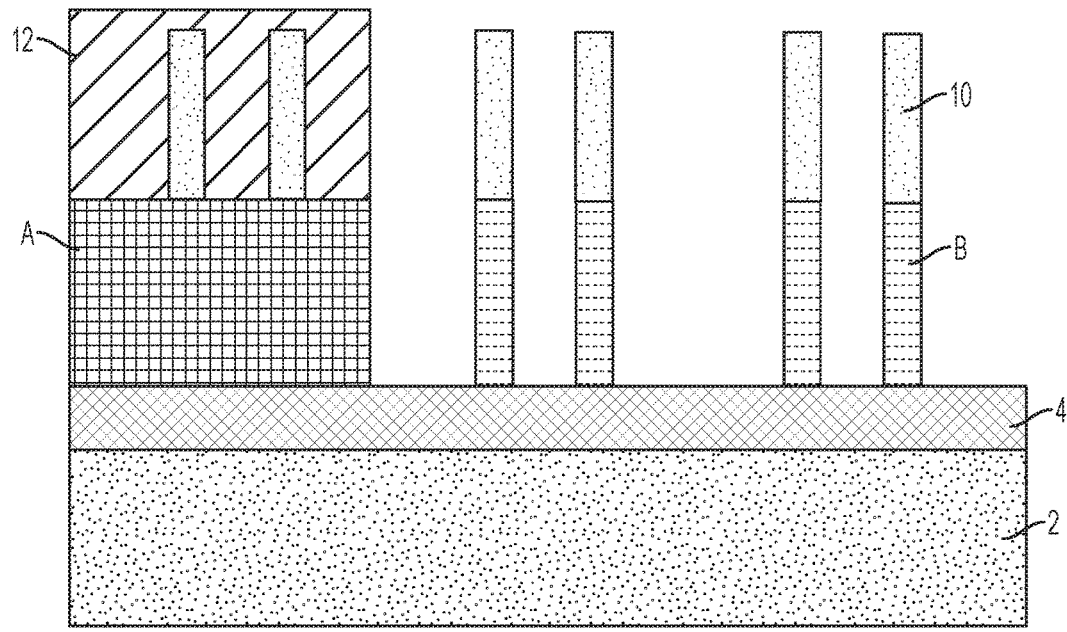

FIG. 3 illustrates that precursor fins 102 can be masked via a first masking layer 12. In one embodiment, the mask can include a photoresist. A layer portion B reactive ion etching operation can then be performed to etch into layer portion B elongating fins 104 and fins 106 from fin patterning layer 10 into layer portion B. It is noted that the etching of fins 106 can be performed in the same or in a different etching operation as the etching of fins 104. If present, insulator layer 4 can serve as a stopping point for the layer portion B reactive ion etching operation.

Figure 4:
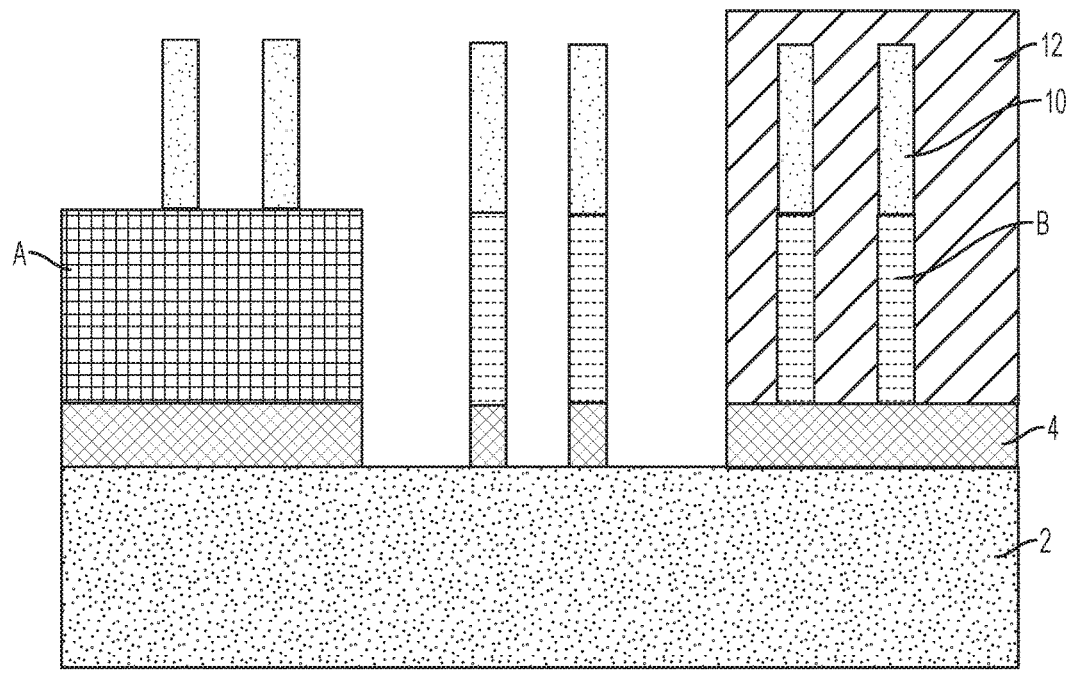

After the first reactive ion etching operation, the masking layer covering fins 102 can be removed and fins 106 can be masked via a second masking layer 12. The mask can include a photoresist. If present, insulator layer 4 can then be etched in an insulator layer etching operation, for example, by reactive ion etching, to expose substrate 2 as illustrated in FIG. 4.

Figure 5:
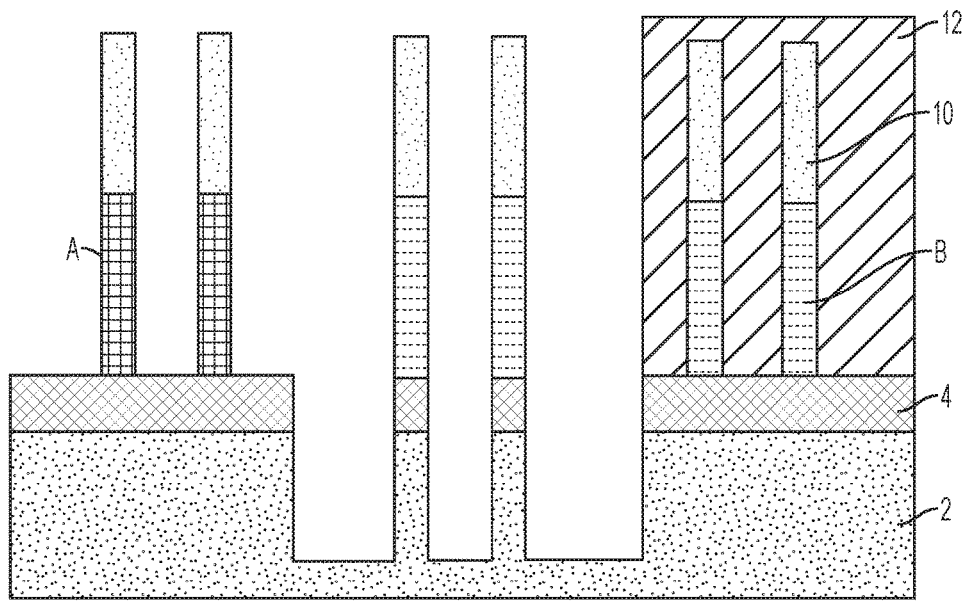

FIG. 5 illustrates that an ion etching operation can then be performed to etch into layer portion A and elongating fins 102 into layer portion A. If present, insulator layer 4 can serve as a stopping point for the silicon layer reactive ion etching operation. The silicon layer reactive ion etching operation can also etch into substrate 2; further elongating fins 106 in the decoupling capacitor region into substrate 2 or etching into the substrate can be performed in a separate etching operation.

Figure 6:
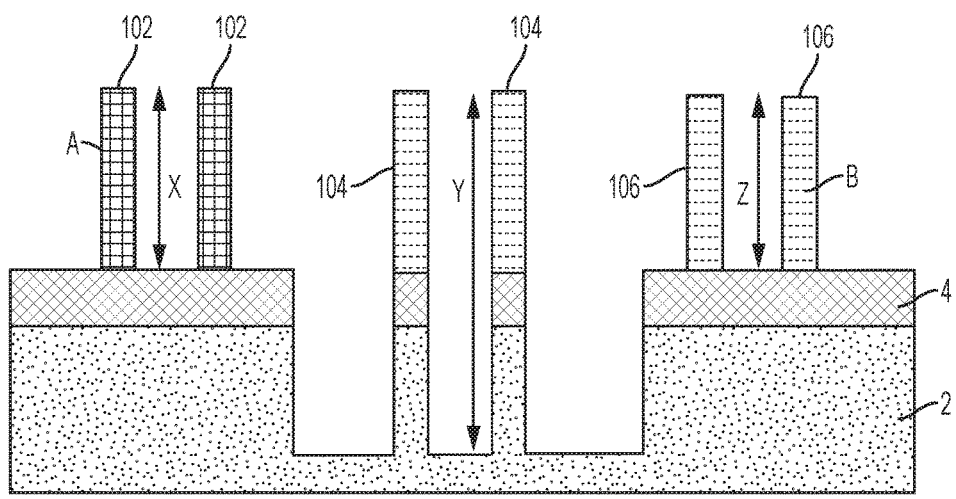

FIG. 6 illustrates that fin patterning layer 10 can then be removed to expose fins 102, fins 104 in the decoupling capacitor region, and fins 106. While it is illustrated that the decoupling fins and fins 106 both include the same material, it is noted that this material can be the same or different in the respective fins depending on the application and on the desired capacitance of the decoupling fins. Fins 102 can be NFET fins and fins 106 can be PFET fins; or fins 106 can be NFET fins and fins 102 can be PFET fins.

The present method of forming the FinFET component can allow for one or both of an increased height of the decoupling fins and a more consistent width of the NFET and PFET fins. The increased height of the decoupling fins can result in an increase in the capacitor surface area, which can ultimately result in an increase in the capacitance per elongated fin. The more consistent width of the NFET and PFET fins can result in an improved performance of the finFET.

A height x of the NFET fins can be 30 to 150 nanometers. A height y of the decoupling fins can be 50 to 400 nanometers. A height z of PFET fins can be 30 to 150 nanometers. The height y of the decoupling fins can be greater than the height x of the NFET fins and the height z of the PFET fins. The height y of the decoupling fins can be greater than or equal to 1.5 times, or 1.5 to 3 times, or 1.5 to 2.5 times one or both of the height x of the NFET fins and the height z of the PFET fins. As used herein, the height of the respective fins can refer to an average height of all of the fins in the respective region (such as an average height of all of the fins in the plurality of NFET fins, etc.).

A width of the NFET fins, the decoupling fins, and the PFET fins can each independently be 5 to 15 nanometers. The respective widths of the NFET fins, the decoupling fins, and the PFET fins can vary by less than or equal to 10%, or by less than or equal to 5%, or by less than or equal to 1%. The widths of NFET fins and the PFET fins can vary by less than or equal to 10%, or by less than or equal to 5%, or by less than or equal to 1%. For example, if the NFET fins have a width n and the PFET fins have a width p, then one or both of the following conditions can be satisfied: (|n−p|)/n*100≤10% and (|n−p|)/p*100≤10%. As used herein, the width of the respective fins can refer to an average width of all of the fins in the respective region (such as an average width of all of the fins in the plurality of NFET fins, etc.).

Figure 7:
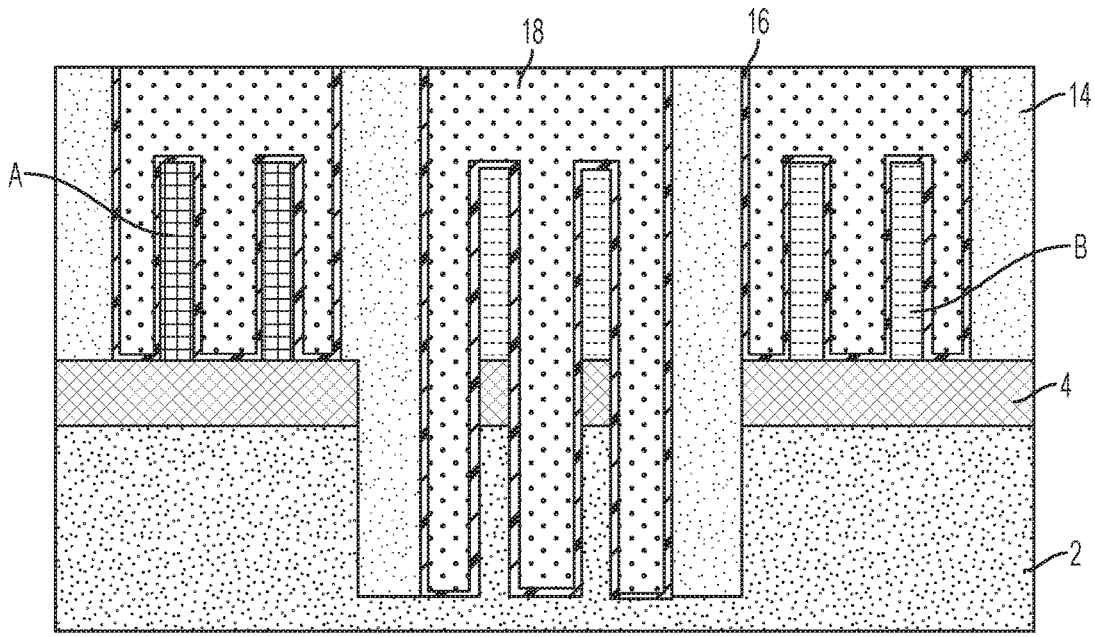
FIG. 7 is an illustration of the cross-section of a cross-section of a further processed finFET component.

The field-effect transistor component can then be further processed, for example, to form the component illustrated in FIG. 7. In FIG. 7, high dielectric constant layer 16 is located around gates 18 and in between gates 18 and fins 102, fins 104, and fins 106. Interlayer dielectric 14 can be located in between gates 18. The field-effect transistor component of FIG. 7 can be prepared by forming spacers, source/drain (not shown), adding an interlayer dielectric. For the NFET and the PFET, the high-k layer 16 can serve as the gate dielectric and the conductor 18 can serve as the gate conductor. For decoupling capacitor, the high-k layer 16 can serve as the node dielectric, the conductor 18 and the fin body can serve as two electrodes of the capacitor. In one embodiment, the decoupling fins have three portions: the top fin portion that includes a material that is substantially the same as the material of transistor fin 106 (e.g., silicon germanium), a middle fin portion that includes an insulator (e.g., oxide), the bottom fin portion that includes a material that is substantially the same as the material of transistor fin 102 (e.g., silicon).

Each of the gates independently can include a conductive material such as poly-crystalline silicon, poly-crystalline silicon-germanium, a metal, a metallic nitride, a metallic silicide, a metallic oxide, or a combination thereof. The metal can include molybdenum, tungsten, titanium, tantalum, platinum, hafnium, or a combination thereof. The metallic nitride can include molybdenum nitride, tungsten nitride, titanium nitride, tantalum nitride, or a combination v. The metallic silicide can include nickel silicide, cobalt silicide, tungsten silicide, titanium silicide, tantalum silicide, platinum silicide, erbium silicide, or a combination thereof. The metallic oxide can include ruthenium oxide, indium tin oxide, or a combination thereof.

The high dielectric constant layer can have a permittivity of greater than or equal to 5, or greater than or equal to 10, or greater than or equal to 20. The high dielectric constant layer can include silicon nitride ($Si_3N_4$), hafnium dioxide ($HfO_2$), hafnium tantalum titanium oxide (HfTaTiO), hafnium silicate ($HfSiO_4$), nitrided hafnium silicates (HfSiON), hafnium oxynitride (HfON), zirconium dioxide ($ZrO_2$), zirconium oxynitride (ZrON), zirconium silicate ($ZrSiO_4$), aluminum oxide ($Al_2O_3$), germanium oxynitride ($GeO_xN_y$), or a combination thereof.

The interlayer dielectric can include an insulator such as silicon oxide. In one embodiment, the interlayer dielectric can include a low dielectric constant material. For example, the interlayer dielectric can have a permittivity of less than or equal to 4.5, or less than or equal to 3. The low dielectric constant material can include methyl silsesquioxane (MSQ), hydrogen silsesquioxane (HSQ), SiOF, and the like, or a combination thereof. The presence of the interlayer dielectric can reduce parasitic capacitances between respective metal layers.

Figure 8:
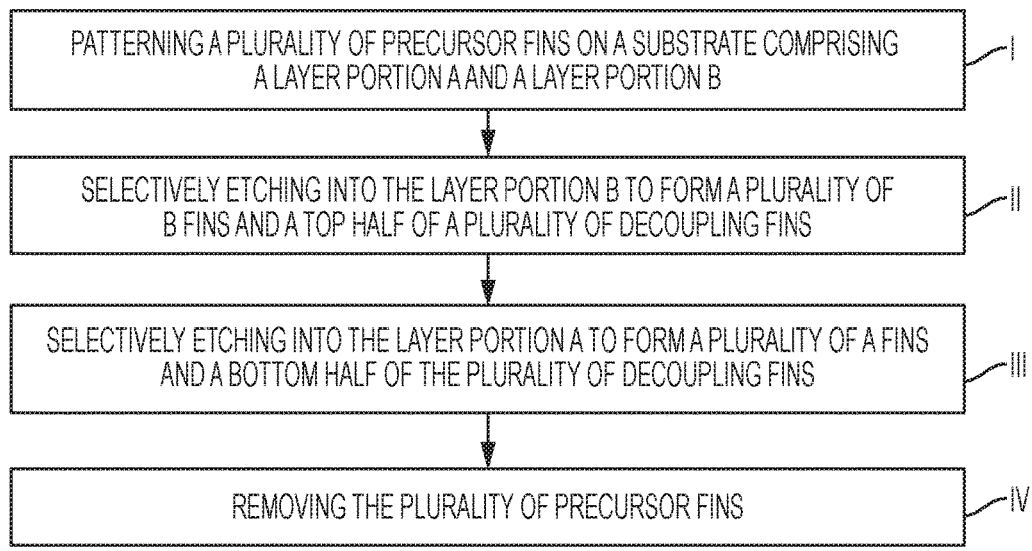
FIG. 8 is an illustration of an embodiment of a method of forming a FET component.

FIG. 8 is an illustration of an embodiment of a method of forming the finFET component.

Block I includes patterning a plurality of precursor fins on a substrate having a layer portion A and a layer portion B. A first portion of the fins are located on the layer portion A and a second portion of the fins are located on the layer portion B.

Block II includes selectively etching into the layer portion B to form the plurality of B fins. For example, Block II can include masking a first portion of the precursor fins located on layer portion A, etching into the layer portion B, and unmasking the first portion of the precursor fins. Etching into the layer portion B can form a top half of a plurality of decoupling fins and a plurality of B fins, for example, a plurality of PFET fins.

Block III includes selectively etching into the layer portion A to form a plurality of A fins and into the substrate to form a bottom half of the plurality of decoupling fins. For example, Block III can include masking the plurality of B fins and etching into the layer portion A to form a plurality of A fins (for example, a plurality of NFET fins) and etching into the substrate to form a bottom half of the plurality of decoupling fins.

Block IV includes removing the plurality of precursor fins to expose the A fins, the decoupling fins, and the B fins. For example, Block IV can include first unmasking the B fins and removing the plurality of precursor fins to expose the A fins, the decoupling fins, and the B fins.

The finFET component can be used in many different kinds of circuits, such as high performance logic, low power logic, or high density memory devices, including high density multi-gigabit DRAMs. Moreover, the finFET components can be readily combined with each other and other elements; for example, they can be combined with CMOS FinFETs, resistors, diodes, memory cells, and so forth, in any combination.

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular. "Or" means "and/or".

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form described herein. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There can be many variations to this diagram or the steps (or operations) described therein without departing from the spirit of the invention. For instance, the steps can be performed in a differing order or steps can be added, deleted or modified. All of these variations are considered a part of this invention.

The descriptions of the various embodiments of the present invention have been presented for purposes of illustration, but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present.

The descriptions of the various embodiments of the present invention have been presented for purposes of illustration, but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor structure, comprising:
   a substrate;
   an NFET fin on the substrate, the NFET fin comprising a first material;
   a PFET fin on the substrate, the PFET fin comprising a second material; and
   a decoupling fin on the substrate, the decoupling fin between the NFET fin and the PFET fin, a first portion of the decoupling fin comprising the first material and a second portion of the decoupling fin comprising the second material;

wherein a height of the decoupling fin is greater than a height of the NFET fin and a height of the PFET fin;

wherein the NFET fin comprises a first width, the PFET fin comprises a second width, and an absolute difference between the first and second widths is less than about 10 percent.

2. The semiconductor structure of claim 1, wherein the height of the decoupling fin is greater than or equal to 1.5 times the height of the NFET fin.

3. The semiconductor structure of claim 1, wherein the height of the decoupling fin is greater than or equal to 1.5 times the height of the PFET fin.

4. The semiconductor structure of claim 1, wherein the absolute difference between the first and second widths is less than about 5 percent.

5. The semiconductor structure of claim 1 further comprising an insulator layer between the substrate and the NFET fin and between the substrate and the PFET fin.

6. The semiconductor structure of claim 5, wherein the insulator layer comprises a buried oxide layer.

7. The semiconductor structure of claim 1 further comprising a plurality of gates located around the NFET fin, the PFET fin, and the decoupling fin.

8. The semiconductor structure of claim 7 further comprising a high dielectric constant layer located between the fins and the plurality of gates.

9. The semiconductor structure of claim 8 further comprising an interlayer dielectric separating the plurality of gates from one another.

\* \* \* \* \*